United States Patent [19]

Swiggard

[11] Patent Number: 5,007,980
[45] Date of Patent: Apr. 16, 1991

[54] LIQUID ENCAPSULATED ZONE MELTING CRYSTAL GROWTH METHOD AND APPARATUS

[75] Inventor: Edward M. Swiggard, Vienna, Va.

[73] Assignee: SFA, Inc., Hyattsville, Md.

[21] Appl. No.: 265,533

[22] Filed: Nov. 1, 1988

[51] Int. Cl.$^5$ .............................................. B32B 00/00
[52] U.S. Cl. .............................. 156/620.7; 156/616.1; 156/616.2; 156/616.3; 156/616.4; 156/DIG. 81; 156/DIG. 72
[58] Field of Search ............... 156/616.1, 616.2, 616.3, 156/616.4, 616.41, DIG. 64, DIG. 70, DIG. 72, DIG. 92, DIG. 93, 605, 620.7; 422/245, 248, 249, 250

[56] References Cited

U.S. PATENT DOCUMENTS

| | | | |
|---|---|---|---|
| 3,243,267 | 3/1966 | Piper | 156/DIG. 72 |
| 4,083,748 | 4/1978 | Gault | 156/DIG. 70 |
| 4,265,661 | 5/1981 | Ware | 156/616.2 |
| 4,521,272 | 6/1985 | Gault | 156/616 |
| 4,578,145 | 3/1986 | Bartlett et al. | 156/DIG. 70 |
| 4,740,264 | 4/1985 | Naumann et al. | 156/DIG. 93 |
| 4,824,520 | 4/1989 | Morrison | 156/DIG. 92 |

OTHER PUBLICATIONS

Swiggard, "Liquid Encapsulation Zone Refining (LE-ZOR)", *Journal of the Electrochemical Society*, vol. 114, No. 9, pp. 976–977 (1967).
Johnson, "Liquid Encapsulated Floating Zone Melting of GaAs", *Journal of Crystal Growth*, vol. 30, pp. 249–256 (1975).
Swiggard et al., "Preparation of Bulk Alloys of III-V Compounds", *Inst. Phys. Conf. Ser.*, No. 65, Ch. 1 (1983).

*Primary Examiner*—Gary P. Straub
*Attorney, Agent, or Firm*—Foley & Lardner, Schwartz, Jeffery, Schwaab, Mack, Blumenthal & Evans

[57] ABSTRACT

A method and apparatus for growing an extended length single crystal of a Group III-V or II-VI material such as GaAs by moving a crucible containing a seed crystal and precompounded crystal material encapsulated in a molten encapsulant preferably vertically in a multi-zone furnace between two furnace zones maintained at temperatures above the melting point of the encapsulant but below the melting point of the crystal material through an intervening short "spike" zone maintained at a temperature at least equal to the melting temperature of the crystal material to crystallize the precompounded crystal material with the seed crystal, and tipping the crucible in the furnace, e.g. by tipping the furnace with the crucible in it, to decant the encapsulant prior to recovering the crystal.

24 Claims, 5 Drawing Sheets

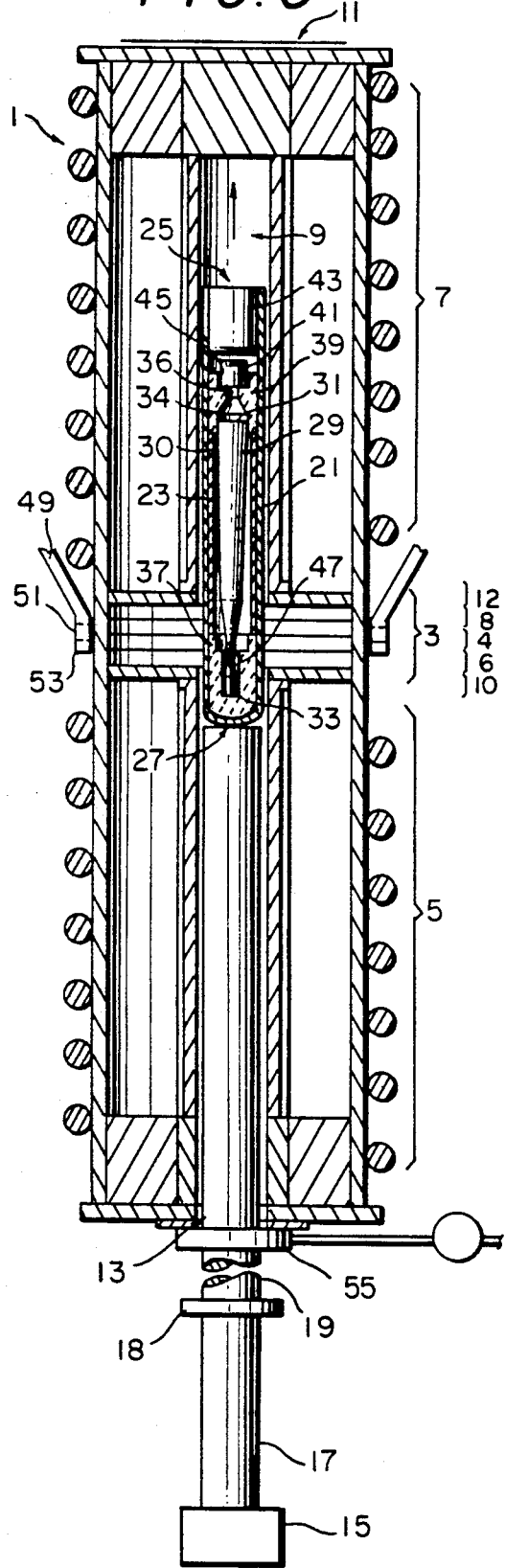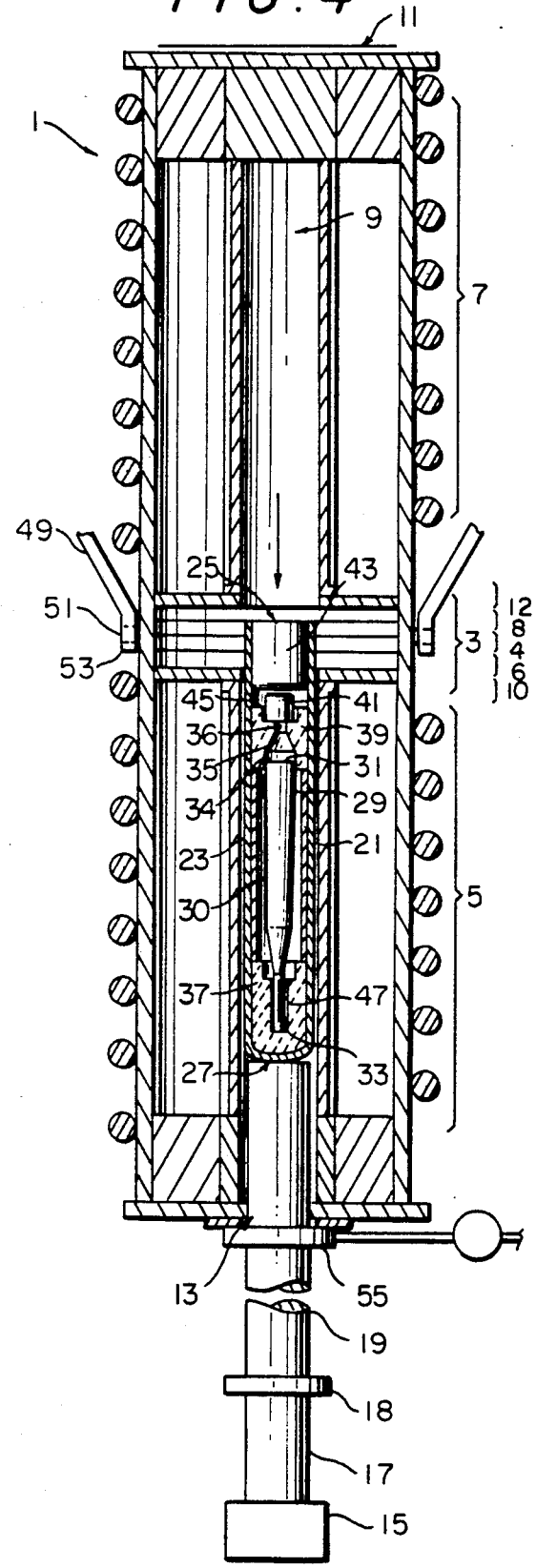

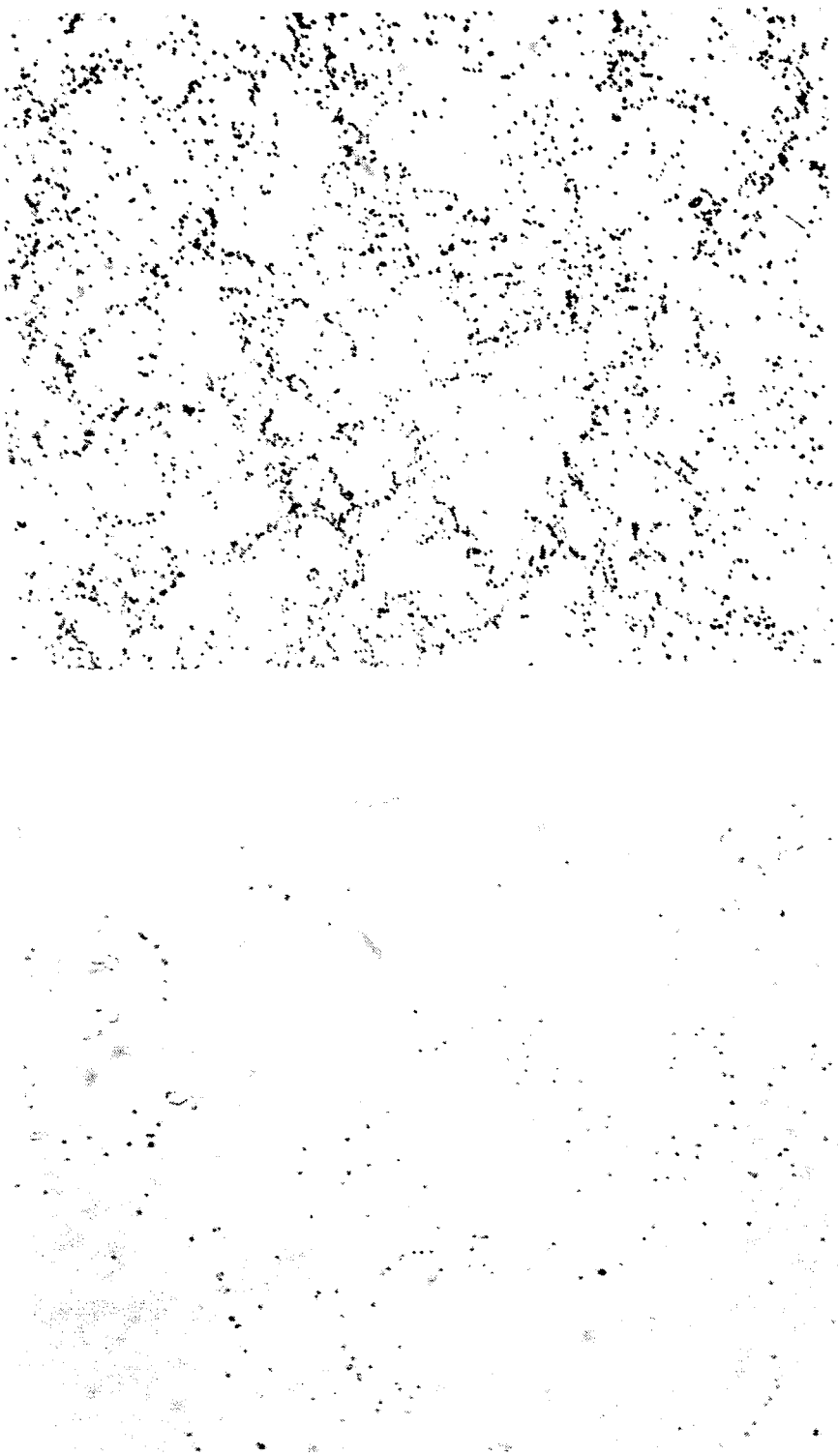
FIG. 9 Commercial LEC GaAs x50
FIG. 8 GaAs According to Invention x50

LIQUID ENCAPSULATED ZONE MELTING CRYSTAL GROWTH METHOD AND APPARATUS

The United States government has certain rights in this invention pursuant to a contract awarded by the U.S. Naval Research Laboratory.

BACKGROUND OF THE INVENTION

This invention relates to a crystal growth procedure and apparatus for growing single crystals of III-V or II-VI materials. The technique is capable of producing extended length single crystals having a highly uniform chemical composition, a low and uniform dislocation density, and a uniform concentration of dopants throughout the crystal.

There are several different growth techniques for producing single crystals of compound semiconductors to be used as substrates for luminescent diodes, transistors, and other discreet electronic devices as well as substrates for integrated circuit chips. The III-V and the II-VI compounds are formed by the combination of elements from Group III and Group V or from Group II and Group VI, respectively. Crystal growth difficulties for such compounds arise from a combination of high melting temperatures, reactivities of the elements or the compound with boat or ampoule materials at elevated temperatures, large differences between the vapor pressures of the constituents of a compound at elevated temperature, large differences between the thermal conductivity of the melt and that of the solid, and in some cases, a high vapor pressure at the melting temperature. Even when single crystals are grown, crystal quality can be adversely affected by having an impurity content, a dislocation density, or an excess of one of the constituents which is too high and/or non-uniform in distribution. Crystals suffering from these defects result in electronic devices which have neither optimum nor reproducible operating parameters, are difficult to process reproducibly, and have a low reliability for integrated circuit applications. All the previously known growth techniques produce crystals that have one or more of the deficiencies listed above.

One known crystal growth technique is the Bridgman technique. Basically a boat of molten GaAs, for example, sits in a uniform temperature zone above the melting point of GaAs, except for one end which contains a single crystal seed and protrudes into a temperature zone below the melting point of GaAs. Crystal growth is accomplished by moving the boat relative to the furnace such that the end of the boat containing the single crystal seed travels out of the melt zone into the cooler zone. Typically the boat containing the GaAs and the surrounding ampoule, which contains an arsenic atmosphere, are made of silica. There are generally two problems with Bridgman crystals. The impurity concentration is too high due to a reaction between Ga or GaAs and $SiO_2$ at elevated temperatures, and the concentration of certain impurities or dopants is non-uniform across the length of the solidified boule.

Another growth technique is the gradient freeze procedure. An example of a gradient freeze technique is disclosed in Gault, U.S. Pat. No. 4,521,272. This technique differs from the Bridgman technique in that the boat of molten GaAs sits in a temperature gradient rather than in a uniform temperature zone. The temperature gradient is such that most of the single crystal seed is at a temperature below the melting point of GaAs, and the rest of the boat is at a temperature above the melting point of GaAs. The location of the melting temperature of GaAs is such that part of the starting single crystal seed gets melted. Crystal growth is accomplished by slowly lowering the temperature of the boat while maintaining the temperature gradient across the boule of the boat. The boat or crucible is usually made of either $SiO_2$ or pyrolytic boron nitride. The problems with this technique are a nonuniform dopant, a high impurity concentration, and a limited length for the resulting crystal. The limitation on crystal length is due to the melting temperature and the temperature gradient that the melt is exposed to. Since GaAs melts at approximately 1236° C. and the rest of the melt is progressively hotter, a very long boat would experience very high temperatures which approach the softening temperature of the $SiO_2$ ampoule containing the boat and arsenic atmosphere.

A third growth technique is the liquid encapsulation Czochralski (LEC) process. In the LEC process, molten GaAs contained in a pyrolytic boron nitride crucible is encapsulated or covered by a layer of molten $B_2O_3$. A single crystal seed is lowered through the molten $B_2O_3$ into the molten GaAs. If the melt temperature and the temperature gradient across the GaAs/$B_2O_3$ interface is optimal, then crystal growth is accomplished by slowly withdrawing the seed and slowly lowering the melt temperature. Problems encountered in LEC crystals are that the dislocation density is too high and is non-uniform across the diameter of the crystal, the impurity or dopant concentration is non-uniform across the length of the crystal, and the concentration of constituents is non-uniform across the diameter and across the length of the crystal.

Other attempts have been made to grow single crystals of III-V or II-VI material. All have failed to produce crystals of optimal quality. Swiggard, "Liquid Encapsulation Zone Refining (LEZOR)", *Journal of the Electrochemical Society*, Vol. 114, No. 9, pages 976-7 (1967), discloses an early attempt by the present inventor at vertical zone refining with a $B_2O_3$ encapsulant. Material to be crystallized and $B_2O_3$ were loaded into a quartz capsule and subjected to repeated zone melting, but the resulting crystal always fractured upon removal from the boric oxide.

Johnson, "Liquid Encapsulated Floating Zone Melting of GaAs", *Journal of Crystal Growth*, Vol. 30 pages 249-56 (1975), attempted vertical zone refining with a $B_2O_3$ encapsulant using fused silica glassware. The boric oxide was first melted and a feed rod of GaAs was then immersed therein. A floating molten zone held in place by surface tension was established in a central section of the rod, but the ends of the feed rod were never melted. Polycrystalline GaAs crystals up to 10 mm in diameter were grown, but single crystals could not be obtained. Attempts to work with larger diameter zones resulted in molten zones which sagged badly.

Swiggard et al., "Preparation of Bulk Alloys of III-V Compounds", *Inst. Phys. Conf. Ser.* No. 65, Ch. 1 (1983), describes horizontal zone refining and crystal growth using GaAs and $B_2O_3$ in a pyrolitic boron nitride crucible. After the desired number of molten zone passes, methanol was bubbled through the molten boric oxide to separate it from the grown crystal material. Difficulties were encountered in controlling the shape of the melt (freezing) interface with this horizontal technique and only polycrystals were obtained.

There is a need for a process and apparatus for growing larger single crystals with more uniform composition.

SUMMARY OF THE INVENTION

It is therefore an object of the present invention to provide a new process and apparatus for growing single crystals of Group III-V or II-VI crystal material.

It is also an object of the present invention to provide a method and apparatus for growing single crystals in which stable melt zones of larger diameter can be maintained.

Another object of the present invention is to provide a method and apparatus for growing Group III-V or II-VI crystals in which undesired polynucleation can be reliably prevented.

It is a further object of the present invention to provide a method and apparatus for growing single crystals with low and substantially uniform dislocation densities.

A further object of this invention is to provide an apparatus that includes a vertical crystal growth crucible composed of material which is unreactive toward a Group III-V or II-VI material or encapsulant at elevated temperatures and in which crystal material can be completely encapsulated by molten encapsulant.

Yet another object of this invention is to provide a vertical crystal growth apparatus including a furnace with a spike melting zone such that solid material which has been recrystallized and solid material to be melted lie on opposite sides of the melting zone which enables control of the growth interface shape.

An additional object of this invention is to provide an apparatus that includes a furnace that can be reoriented about a horizontal axis to facilitate removal of an encapsulant.

These and other objects of the invention are achieved by providing a method of growing single crystals comprising the steps of:

(a) introducing a seed crystal, an amount of precompounded crystal material, and an amount of an encapsulant material having a melting temperature lower than the melting temperature of said precompounded crystal material sufficient to encapsulate said precompounded crystal material when melted, into a non-reactive pyrolytic vessel;

(b) heating said vessel in a furnace to a temperature above the melting point of said encapsulant and below the melting point of said precompounded material and said seed crystal, and melting said encapsulant to encapsulate said precompounded material;

(c) passing said vessel through a furnace zone having a length shorter than the length of said vessel and maintained at a temperature at least equal to the melting temperature of said precompounded crystal material to melt said precompounded crystal material and into an adjacent furnace zone maintained at a temperature above the melting temperature of said encapsulant and below the melting temperature of said crystal material to crystallize said precompounded crystal material in contact with said seed crystal so as to form a single crystal of said crystal material;

(d) tipping said vessel while maintaining said vessel at a temperature above the melting point of said encapsulant and below the melting point of the crystallized material to decant said encapsulant from said vessel; and (e) recovering said single crystal of said crystal material from said vessel.

According to a preferred embodiment, the vessel is passed from a first furnace zone maintained above the melting temperature of the encapsulant but below the melting point of the crystal material through an adjacent second furnace zone having a length shorter than the length of the vessel and maintained at a temperature at least equal to the melting temperature of the crystal material to form a narrow molten zone which moves through the crystal material and into an adjacent third furnace zone located on the opposite side of the second zone from the first zone and maintained at a temperature above the melting temperature of the encapsulant but below the melting temperature of the crystal material.

According to a further aspect of the invention, the objects are achieved by providing an apparatus for growing crystals, comprising:

(a) a vessel comprising a pyrolytic crucible chemically resistant to molten Group III-V or II-VI material;

(b) a furnace with three successively adjacent and independently temperature controlled furnace zones, including a central zone of shorter length than said vessel;

(c) a mechanism for controllably moving said vessel through said furnace zones; and (d) means for tipping said vessel in said furnace to decant a molten encapsulant from said crucible.

BRIEF DESCRIPTION OF THE DRAWINGS

The invention will be described in further detail with reference to the accompanying drawings in which:

FIG. 3 is a cross-sectional view of the apparatus shown in FIG. 1 illustrating the position of the crystal growth container at the beginning of the crystal growth process.

FIG. 4 is a cross-sectional view of the apparatus shown in FIG. 1 illustrating the crystal growth container after passage through the melting zone.

FIG. 8 is a photomicrograph showing the etch pit density (EPD) of the GaAs crystal shown in FIG. 7.

FIG. 9 is a photomicrograph showing the etch pit density (EPD) of a conventionally grown LEC GaAs crystal.

DETAILED DESCRIPTION OF PREFERRED EMBODIMENTS

The present invention will be described mainly in terms of growing GaAs. However, it is understood that such description is merely exemplary and that the inventive concept described is equally applicable to the growth of other III-V compounds, such as InP or GaP, or to the growth of II-VI compounds, such as CdTe or ZnS.

Figure 1:
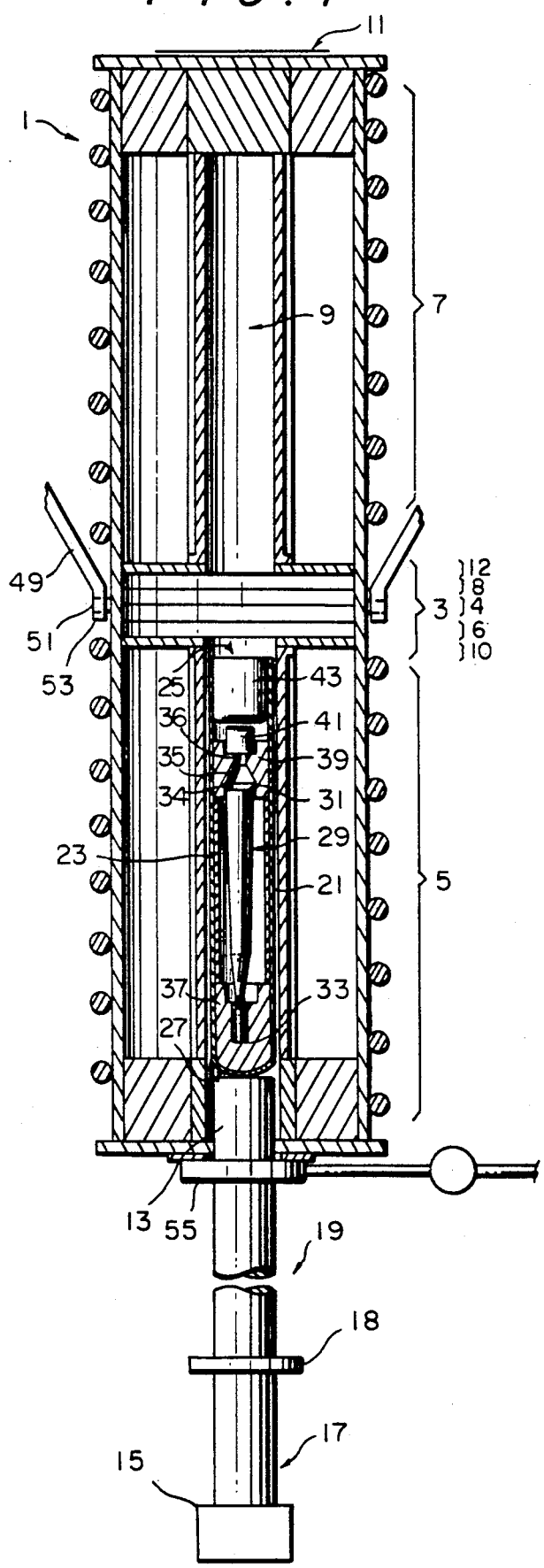
FIG. 1 is a vertical cross-sectional view of an apparatus for growing single crystals according to the present invention.

FIG. 1 shows an apparatus useful for growing crystals according to the present invention. The apparatus comprises a vertically oriented high temperature furnace 1 positioned on a frame 49. Furnace 1 is mounted on frame 49 by means of laterally projecting shafts 51 journaled in pillow blocks 53 to allow the furnace to be inverted or tipped 180° about a horizontal axis. The furnace 1 comprises a centrally located, separately controlled molten temperature zone ("spike zone") 3, an independently controlled lower furnace zone 5 and an independently controlled upper furnace zone 7 on opposite sides of the "spike zone" 3. Both the lower furnace zone 5 and upper furnace zone 7 are longer in length than the "spike zone" 3. The temperatures of the lower furnace zone and the upper furnace zone may be set at the same or different temperatures, but both are set at a temperature below that of the "spike zone" when growing crystals.

Due to thermal gradients, as well as the fact that the heating element in the central zone 3 of the illustrative embodiment is somewhat shorter in length than the central zone itself, the central zone 3 may be thought of as subdivided into five subzones. A centermost subzone 4 is surrounded by a lower transitional heated subzone 6 and an upper transitional heated subzone 8. When growing crystals, the temperatures of subzones 4, 6 and 8 are raised above the temperature(s) of lower furnace zone 5 and upper furnace zone 7, but only the temperature of the centermost subzone 4 will equal or exceed the melting point of the crystal material. A lower thermal gradient subzone 10 is located between the bottom of the central zone heating element and the lower furnace zone 5, and an upper thermal gradient subzone 12 is located between the top of the central zone heating element and the upper furnace zone 7. Subzones 10 and 12 are not heated, and during the crystal growth process they act as temperature buffers between the relatively hotter transitional heated subzones 6 and 8 of the spike zone and the relatively cooler lower and upper furnace zones 5 and 7.

Furnace 1 contains an interior cavity 9 running along its length. Cavity 9 is closed at its top 11 and open at its bottom 13. A mechanical drive system 15 comprising a reciprocating drive member 17 is also shown. Any suitable drive system can be used. For example, applicant has successfully used a lever arm mounted on a screw jack driven by a reversible, variable speed electric motor. Various other mechanical, hydraulic or pneumatic drive arrangements may occur to persons skilled in the art.

Affixed to the top of reciprocating drive member 17 is a vertical support rod 19 made of thermally resistant material such as a high purity alumina ceramic. To better control thermal losses from the furnace, support rod 19 desirably may be configured as a hollow alumina tube filled with alumina silicate insulation or provided with transverse alumina silicate baffles separated by tubular alumina spacers. An insulating collar 18, preferably made of thermally resistant ceramic material, is interposed between drive member 17 and support rod 19. An insulating annular mount (not shown) for crystal growth container 21 desirably may also be provided at the top of support rod 19.

Drive system 15 causes the reciprocating member 17 to move the vertical support rod 19 up and down through the interior cavity 9 and through the three adjacent furnace zones 3,5,7. The reciprocating drive member allows the vertical support rod to enter the furnace cavity through opening 13. The support rod may also be fully withdrawn from the cavity.

FIG. 1 also shows a clamp 55 which attaches to vertical support rod 19. At the end of the crystal growth procedure the clamp is used to hold the support rod in place while the furnace is inverted. Axial pillow blocks 53 located on either side of the furnace are loosened when the furnace is to be tipped.

A crystal growth container 21 is placed on top of the vertical support rod 19. The crystal growth container can best be seen in FIG. 2. The container is thermally resistant and is capable of withstanding the pressures employed for single crystal growth of Group II-VI or III-V crystalline compounds. Container 21 comprises an outer vessel 23 with an open top end 25 and a closed bottom end 27. The outer vessel is made of thermally resistant material which is unreactive to Group II-VI and III-V compounds and their constituent elements. In the preferred embodiment, the outer vessel is made of quartz ($SiO_2$). Container 21 also comprises a growth crucible 29 which is positioned inside the outer vessel 23 and rests on a bottom support component 37 therein. The growth crucible is also made of thermally resistant material which is unreactive to Group II-VI and III-V compounds and their constituent elements. In the preferred embodiment, the growth crucible is made of pyrolitic boron nitride. Alternatively, sintered AlN might be used to make the growth crucible 29. The growth crucible is hollow and is tubular in shape. Preferably, the growth crucible tapers slightly outwardly towards its top end over its entire length to facilitate subsequent extraction of a grown crystal therefrom. Growth crucibles which taper from 0.50 to 2 may be successfully employed.

Crucible 29 has an open top end 31 and an open bottom end 33. The open bottom end of the growth crucible is inwardly tapered downward and formed in the shape of a funnel. The bottom end 33 of the growth crucible 29 is encased by the bottom support component 37, which in turn fits inside the bottom of outer vessel 23 and rests on the closed end 27 therein. The top end 31 of growth crucible 29 is surrounded by a top support component 39, and is received in a tapered recess 34 in top support component 39. A tapered transition zone 35 connects recess 34 with a narrow orifice 36 which opens through the top of top support component 39 to facilitate removal of a liquid encapsulant as described hereinafter. The tapered portion of the top support component also serves to hold the grown crystal material when the furnace is inverted or tipped. Top and bottom support components 37 and 39 are desirably made of thermally resistant material which is unreactive at elevated temperatures toward Group II-VI and III-V compounds and their constituent elements. In the preferred embodiment, both the top and bottom support components of the growth crucible are made of hot pressed boron nitride.

Figure 2:
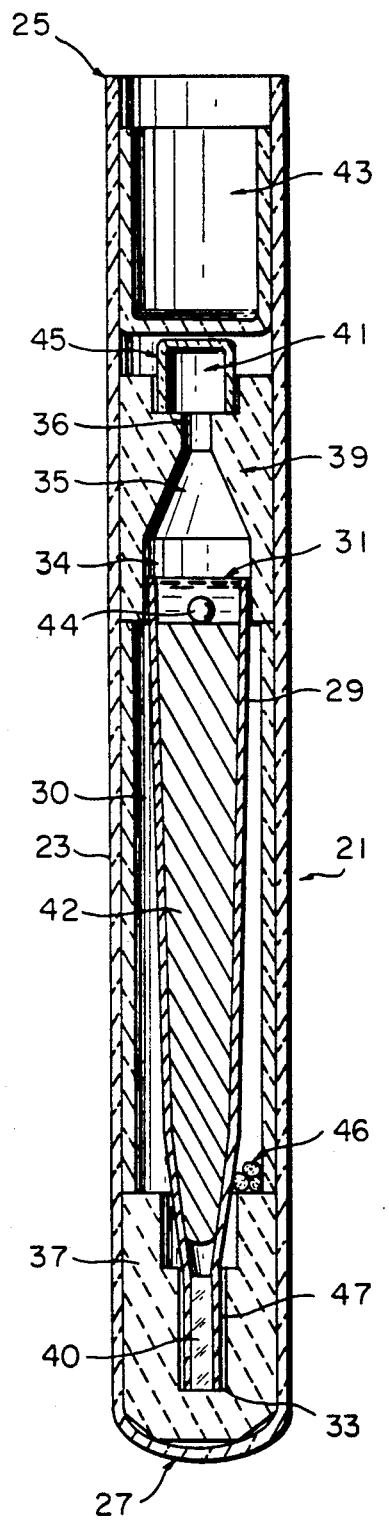
FIG. 2 is a cross-sectional view of a crystal growth container for use in the apparatus of FIG. 1.

FIG. 2 also shows a vertical cylindrical spacer tube 30 which is positioned inside the outer vessel 23 surrounding the main cavity of growth crucible 29 and resting on the bottom support component 37. Spacer tube 30 supports the top support component to provide clearance for the crucible so that when the crystal growth container is inverted in the furnace, crucible 29 can slide away from bottom support component 37 to expose the open bottom 33 of the crucible, thereby facilitating release of the crystal from the crucible. The slight shock as the crucible drops against the top support component may also assist in dislodging the crystal.

In growing a GaAs crystal, arsenic hereinafter described is placed inside the spacer tube before commencing the crystal growth procedure. The arsenic subsequently evaporates and maintains an atmosphere of pressure inside the growth vessel 23, thereby preventing the vessel from collapsing at elevated temperatures. The gaseous arsenic atmosphere also prevents loss of arsenic through evaporation from the molten GaAs.

An inverted cup 41 is positioned over the open orifice 36 on top support component 39. Cup 41 rests in a slight depression 45 on the top support component 39. The inverted cup is used at the end of the crystal growth procedure to collect liquid encapsulant decanted from the growth crucible. A plug 43 fits within the outer vessel 23 over the inverted cup 41. The plug is used to seal the outer vessel before beginning crystal growth once all the aforementioned components of the growth container 21, including the inverted cup, have been placed therein. Preferably, the inverted cup and the plug should be positioned such that they do not touch, thereby allowing for their expansion during heating which will avoid breakage. The inverted cup and plug are also made of thermally resistant material which is unreactive towards Group II-VI and III-V compounds and their constituent elements. In a preferred embodiment, the cup and plug are each made of quartz.

A seed well 47 is located within the bottom tapered end 33 of the growth crucible 29, surrounded by the bottom support component 37. Within the seed well is placed a seed crystal of the Group II-VI or III-V crystalline compound to be grown. Preferably, the seed crystal fits snugly, but not tightly, inside the seed well. A snug fit, i.e. a "slip" fit, will help ensure that molten GaAs does not run down along the sides of the seed crystal and subsequently cause undesirable polycrystalline growth. If necessary a seed crystal may be machined to provide the desired snug fit.

Still referring to FIG. 2, when commencing crystal growth, the growth crucible 29, without the top support component, the inverted cup or the plug, is fitted within the spacer tube 30 of the outer vessel 23 in the manner previously described. A seed crystal 40 of GaAs is positioned inside the seed well 47 at the bottom of the crucible. Precompounded GaAs 42 is next introduced into the growth crucible 29 via the open top end 31. The precompounded GaAs comes to rest at the bottom of the growth crucible 29 adjacent to and above the seed crystal in the seed well 47. Preferably, there is space between the precompounded GaAs and the seed crystal after its initial positioning in the growth crucible. The amount of GaAs added to the growth crucible will vary, depending on the length of the crystal which is desired. The precompounded GaAs may be machine ground to the interior dimensions of the growth crucible so as to fit snugly therein. Alternatively, the precompounded GaAs may be loaded by vertically stacking preformed blocks on top of each other inside the growth crucible.

Next, an encapsulant 44 is added. For most applications, it is preferred to use dry boric oxide as the encapsulant. Other encapsulant materials which may be used in appropriate circumstances include cesium chloride or eutectic mixtures such as potassium chloride/sodium chloride eutectics. The principal requirements for the encapsulant are that it melt at a lower temperature than the crystal material; that it be at least substantially unreactive toward the crystal material and the crucible material, and that it not exhibit an excessive vapor pressure at the melting temperature of the crystal material.

For preparation of GaAs, preferably a commercially available pellet of preferably boric oxide is loaded on top of the precompounded GaAs. When melted, the boric oxide pellet coats and lines the growth crucible. The boric oxide encapsulant also maintains a 1 to 10 mm cap above the precompounded GaAs after the GaAs has been melted to conform to the growth crucible. By lining the growth crucible the boric oxide prevents contact of the molten GaAs with the sides of the growth crucible. This, in turn, inhibits the phenomenon known as "wetting", whereby molten GaAs in contact with the sides of the growth crucible subsequently forms undesirable polycrystals, rather than the optimal single crystal.

Sufficient clearance should be provided between the precompounded GaAs charge and the wall of the crucible to permit the molten boric oxide to flow down around the charge and coat the crucible wall. If insufficient clearance is present for free downward flow of the molten boric oxide to occur, as in the case of a tightly fitting machine ground GaAs charge, then a small amount of boric oxide may be placed underneath the charge so that when melted, it will be forced up along the sides of the charge to coat the crucible wall.

A small quantity of arsenic 46 is also introduced into the growth vessel 23. In a preferred embodiment, the arsenic is placed on the bottom support component 37 inside the spacer tube 30. As previously mentioned, the arsenic is used to maintain an atmosphere in the growth vessel at the crystal growth temperature and helps prevent the escape of As "bubbles" from the molten GaAs.

After the precompounded crystal material, the encapsulant, and the arsenic are all loaded into the vessel, the top support component 39 is inserted into place resting on spacer tube 30 with the top end 31 of growth crucible 29 received in recess 34, and cup 41 is positioned in depression 45 in inverted fashion over the open orifice 36 of the top support component 39. Plug 43 is then inserted in the outer vessel 23. The crystal growth container 21 is evacuated and then sealed, for example by heat fusing the plug 43 to the outer vessel 23. Desirably, while the the crystal growth container is attached to the evacuating pump, it should be heated overnight in an oven at 250° to 300° C. to drive off any water, for example, water adsorbed by the hot pressed boron nitride support components 37 and 39, before the container is sealed. The plug 43 also serves to keep cup 41 in position over orifice 36.

Referring again to FIG. 1, in order to begin crystal growth, the crystal growth container 21, loaded and sealed as described above is positioned with its bottom end resting on the support rod 19 at the top of the reciprocating member 17 of mechanical drive system 15. This initial positioning takes place with the support rod outside of the furnace cavity to facilitate mounting of the crystal growth container thereon. With the crystal growth container now positioned on the support rod, the mechanical drive system 15 and reciprocating member 17 moves the support rod 19 upward causing the crystal growth container 21 to enter the interior cavity 9 of furnace 1 as shown in FIG. 1. The crystal growth container 21 passes upwardly through the lower furnace zone 5 and through the subzones 10,6,4,8, and 12 of the spike zone 3 until the upper portion of the growth crucible 29 is within the upper furnace zone 7 and the seed crystal in the seed well is positioned just below the centermost subzone of the central spike zone as illustrated in FIG. 3.

The temperatures of all three furnace zones, i.e. the lower furnace zone 5, the upper furnace zone 7, and subzones 4, 6 and 8 of spike zone 3 are initially raised to a temperature above the melting point of the encapsulant boric oxide (approximately 450° C.) but below the melting point of the precompounded GaAs (approximately 1236° C). In the preferred embodiment, all three zones are initially set at a temperature of 1200° C. This temperature will permit the dry boric oxide to melt and coat the interior of the growth crucible without melting the seed crystal or any of the precompounded crystal material.

Once the boric oxide has melted and encapsulated the GaAs charge and the portion of the growth crucible 29 directly above, but not including the seed well 47, is positioned in the central molten subzone 4 of the spike zone 3, then the temperature of the molten subzone 4 is increased to a temperature which will cause the precompounded GaAs positioned directly above the seed crystal 40 to melt. The peak temperature of the molten subzone 4 within the spike zone is set slightly above 1236° C., which is the melting point of GaAs. The required temperature within molten subzone 4 will vary depending upon the precision of the particular furnace which is employed and the configuration of the melting crucible and can readily be determined by a person skilled in the art. The temperatures of transitional subzones 6 and 8 also increase when raising the temperature of molten subzone 4. At this point heated subzones 6 and 8 will have temperatures below the melting point of GaAs, but above the temperatures of furnace zones 5 and 7. The temperatures of the lower furnace zone 5 and the upper furnace zone 7 are not raised, but remain at their initial set temperature, i.e. approximately 1200° C. The seed crystal 40 in the seed well 47, being positioned below the molten subzone 4 of the spike zone 3 and within the transitional heated subzone 6, thermal gradient subzone 10, and possibly lower furnace zone 5, which remain at temperatures below the melting point of the crystal material, is not melted.

Referring now to FIG. 4, the crystal growth container 21 is next slowly lowered through the spike zone into the lower furnace zone 5. The support rod is moved at a rate conducive to crystal growth throughout the entire growth process. Rates in the range of from 1 to 10 mm/hr are generally suitable. The precompounded GaAs contained within the growth crucible 29 melts as it passes with the crystal growth container 21 downward through molten subzone 4 of the spike zone 3, and the molten material conforms to the shape of the growth crucible 29 and is separated from the wall of the growth crucible only by a very thin layer of boric oxide encapsulant which preferentially wets the crucible wall. At this point the molten GaAs material fills in the space which had previously existed between the unmelted precompounded GaAs and the seed crystal.

The molten boric oxide encapsulant prevents the molten GaAs from contacting or "wetting" the crucible walls. This prevents undesired secondary nucleation which may lead to polycrystalline growth. The molten boric oxide also maintains a 1 to 10 mm cap over the GaAs material in the crucible.

As the crystal growth container 21 passes downward into the lower furnace zone 5, the molten GaAs is subjected to temperatures below its melting point and resolidifies. After the crystal growth container 21 has fully entered the lower furnace zone 5 and all of the molten GaAs has resolidified, then the temperature of the spike zone 3 is again lowered to a temperature below the GaAs melting point, preferably, about 1200° C.

Figure 5:
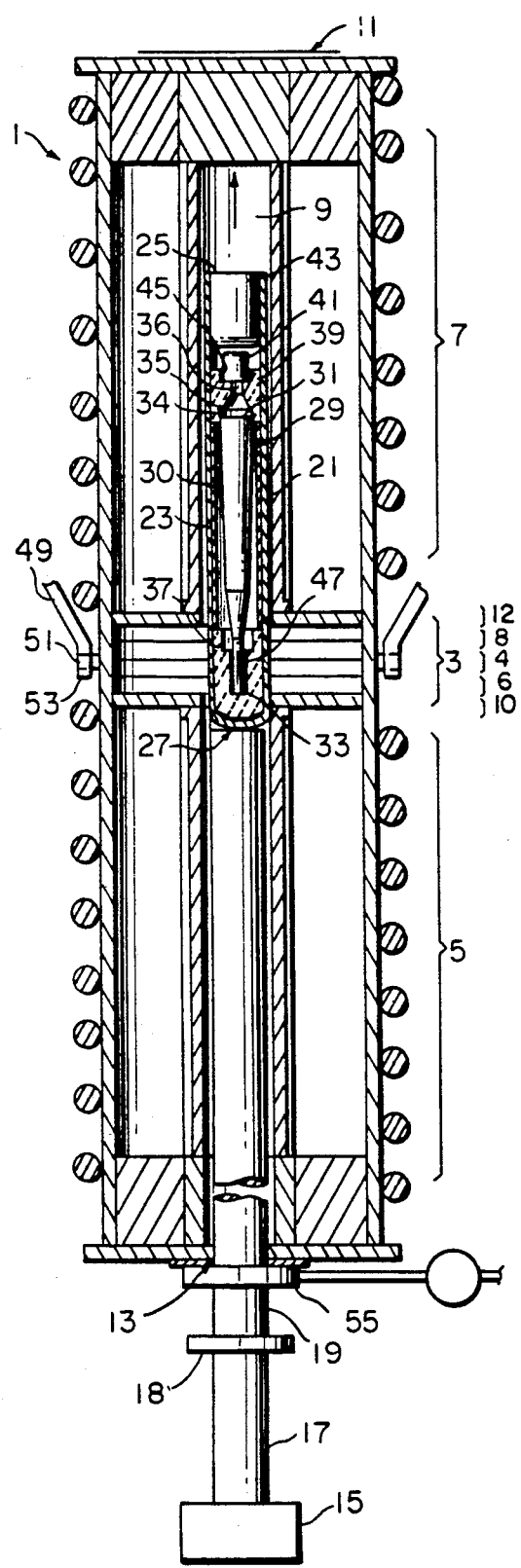
FIG. 5 is a cross-sectional view of the apparatus shown in FIG. 1 illustrating the crystal growth container and part of the seed well repositioned with the seed crystal overlapping into the melting zone.

Referring now to FIG. 5, the crystal growth container 21 is raised again. This time the crystal growth container is positioned with a portion of the seed crystal 40 within the seed well 47 and a part of the growth crucible 29 containing the resolidified GaAs directly above the seed well within the molten subzone 4 of the spike zone 3. Desirably, up to 50% of the seed well containing the seed crystal overlaps into the molten subzone 4 of the spike zone. The molten region is then reestablished within the spike zone 3 by again independently raising the temperature of the spike zone so that the temperature of molten subzone 4 is at the melting point of the GaAs or higher. This time, a portion of the GaAs seed crystal is melted along with the GaAs resolidified material contained within the spike zone 3.

The crystal growth container 21 is then lowered again into the lower furnace zone 5 which has been maintained at 1200° C. The molten GaAs reentering lower furnace zone 5 now starts to solidify in contact with the unmelted portion of the seed crystal, and a single crystal of GaAs starts to form.

Crystal growth is preferably completed once all the GaAs compound material contained within the upper portion of the growth crucible 29 has passed downward from the upper furnace zone 7, through the spike zone 3 where it melts and into the lower furnace zone 5 where it solidifies as a single crystal.

In the described embodiment, the crystal growth container was first positioned in a cold furnace with the seed crystal just below the centermost subzone of the central furnace section 3, and the furnace was then raised to temperature in two stages with the encapsulant being melted in the first stage and the molten zone being established in the crystal material in the second stage. It is, of course, also possible within the scope of the invention to first melt the encapsulant in lower furnace zone 5 or upper furnace zone 7 before moving the crystal growth container into position in the central zone and raising the temperature of the central zone to establish the molten zone in the crystal material.

Also in the preferred embodiment described above, two passes through the molten spike zone 3 were employed, the first pass causing the GaAs compound material to melt so that it can flow into contact with the seed crystal and conform to the shape of the growth crucible, and the second pass facilitating growth of a GaAs single crystal. Alternatively, the crucible may be loaded initially with GaAs preformed to the shape of the growth crucible in contact with the seed crystal, thereby eliminating the need for the first pass through the molten spike zone.

The shape of the liquid-solid interface in the crystal material which exists when the GaAs is passing between the molten region of the spike zone and the lower temperature region of the lower furnace zone is significant. The shape of this liquid-solid interface in the GaAs material is referred to as the growth interface shape. Preferably, the shape of this liquid-solid interface or growth interface shape should be slightly convex with respect to the solid phase of the material. A slightly convex growth interface shape will cause any misalignment occurring as the crystal grows to be directed from the center of the crystal outwards. Hence, single crystal growth will be facilitated. By maintaining a molten region within the spike zone which is considerably shorter in length than the lengths of the surrounding upper and lower furnace zones, the resulting growth interface shape is slightly convex with respect to the solid phase of the material, and an optimal single crystal can be grown.

As the length of the molten spike zone increases with respect to the lengths of the surrounding lower temperature zones, the growth interface shape eventually flattens out. A concave growth interface shape is generally less desirable because any misalignment which occurs as the crystal grows is directed towards the center of the crystal, rather than outward. This may cause polycrystalline formation, rather than the desired single crystal growth.

A low thermal gradient between the liquid and solid phases is also advantageous in GaAs crystal growth. In the preferred embodiment of the present invention, the temperature of the lower/upper furnace zones and the spike zone are set at 1200° C. and about 1236° C. for crystal growth, respectively, thereby allowing for a temperature differential of about 36°. At this temperature differential a low thermal gradient results, which subjects the growing crystal to less thermal stress than would be the case at higher temperature differentials. By reducing thermal stress in the growing crystal, a lower dislocation density can be obtained in the final crystal product.

There are no technical limitations on the size of single crystal which may be grown. The only practical limitations exist with respect to the length of a furnace and crystal growth container those skilled in the art may seek to employ.

If desired, processing may be continued in order to effect zone refining. The molten zone is repeatedly reestablished at the interface between the seed crystal and the GaAs compound material, and is traversed across the GaAs material. Usually at least ten cycles of passing the molten zone across the material is required to purify a significant portion of the crystal. The cooling of the crystal and removal of the boric oxide follows the same procedure hereinafter described.

Also, if desired, dopants can be zone levelled. This procedure differs from that described above in that after the GaAs compound material has been caused to conform to the tapered shape of the crystal growth crucible, a portion of the material is replaced by appropriate quantities of the desired dopants. Differing quantities may be used, depending on the particular dopant and its segregation coefficient. Determination of the amount of dopant to be used in any given case is within the skill of the art. The molten zone is then established in the region where the dopants are located, e.g. adjacent the seed crystal, and the molten zone is moved, if necessary, to melt a small portion of the seed. The container is then lowered through the "spike" region at the rate of 1 to 10 mm per hour as described above.

Once crystal growth is completed, the temperature of the entire furnace 1 is lowered at a rate of up to 60° C. per hour, preferably from 10° to 40° C. per hour, most preferably from 25° to 35° C. per hour, to within the range of 1050°–1200° C. The crystal growth container 21 is then raised through the interior cavity 9 of the furnace, until the top portion of the crystal growth container contacts the closed top end 11 of the furnace. The support rod 19 is then clamped using clamp 55 to prevent any subsequent movement. The support rod is then detached from the reciprocating drive member 17 and insulating collar 18.

Figure 6:
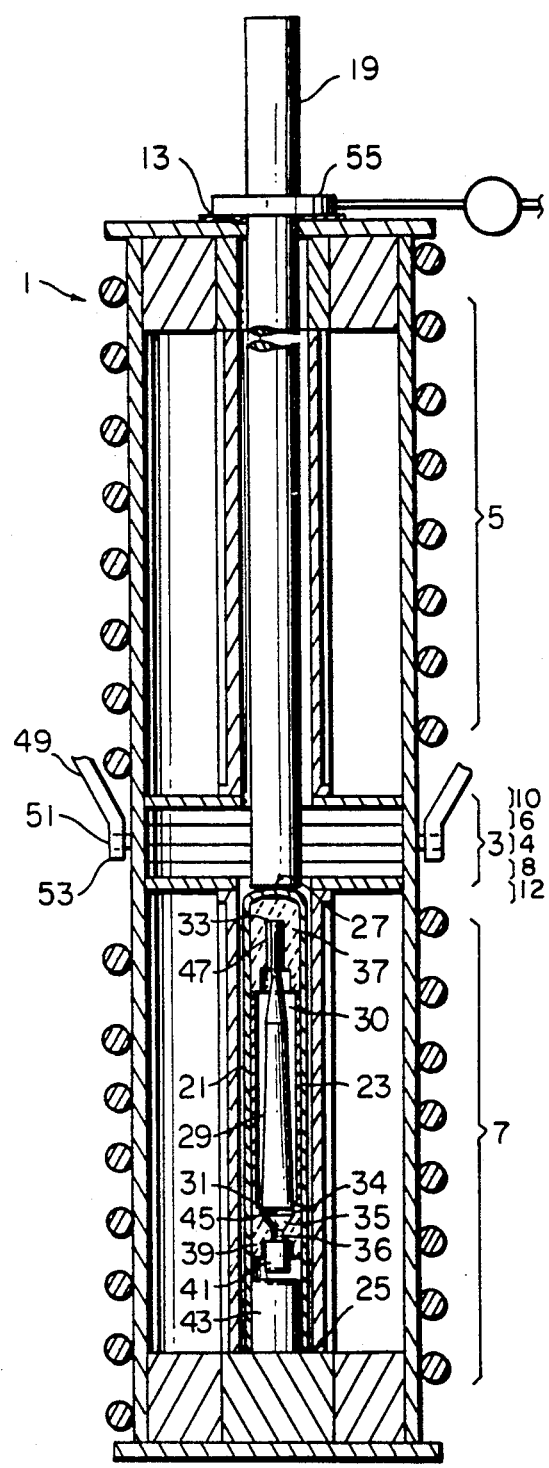
FIG. 6 is a cross-sectional view of the apparatus shown in FIG. 1 illustrating the crystal growth container in inverted position.

Referring now to FIG. 6, the furnace 1 is then pivoted and tipped so that it is upside down. This may be achieved in a number of ways. For example, the furnace 1 may be mounted on a standard "A" frame 49 with an axial pillow block 53 located on either side of the frame 49. Each pillow block has been loosened, the furnace has been tipped over 180°, and the pillow blocks have been retightened to prevent further movement once the furnace is in the inverted position. A clamp 55 is shown holding the support rod 19 in place at a point outside the interior cavity 9 of the furnace.

When the furnace is inverted, the liquid encapsulant boric oxide runs through the open orifice 36 in the now inverted top support component 39 into the cup 41. Depending on the completeness of boric oxide removal, the GaAs grown crystal may release from the crucible and settle into the tapered recess 35 of the inverted top support component. Release of the grown crystal from the crucible is facilitated by the taper of the crucible.

The temperature of the furnace is then lowered until the temperature of the crystal has cooled, permitting its removal from the growth crucible. The temperature may be lowered at rates of up to 200° C. per hour to about 600° C. Preferably, the temperature of the entire furnace 1 is lowered at the rate of 35° C. per hour to approximately 550° C. At that point the furnace may be turned off and allowed to cool slowly to room temperature (approximately 25° C.). A slow rate of cooling inhibits strain within the crystal which results from a large temperature differential forming across the diameter of the crystal.

Once the crystal has cooled, the furnace is then reinverted so that it is right side up again. This may be done by loosening the axial pillow blocks 53 and then pivoting the furnace 180 about its horizontal axis until it is upright. Once the furnace is upright again, the pillow blocks are retightened. The clamp 55 is then detached from the support rod 19, and the growth container is removed from the furnace cavity.

The seal between the plug 43 and the outer vessel 23 of the crystal growth container 21 may then be broken using a hammer, for example. Care should be taken not to damage the other components of the crystal growth container when breaking the seal between the plug and the outer vessel. The cup 41 containing the encapsulant boric oxide is then removed. The growth crucible and any parts adhering thereto are placed in a cleaning solution to dissolve any remaining encapsulant. Methyl alcohol, water, or other suitable solvents may be utilized for this purpose.

After cleaning, the crystal growth container 21 is allowed to dry. The individual components of the crystal growth container can then be separated and the grown crystal recovered. Preferably, the crystal is removed 2–24 hours after drying. The unbroken components of the crystal growth container may be reused for subsequent crystal growth.

Further details of the invention will appear from a consideration of the following example which is illustrative only and is not to be taken as limiting on the invention.

EXAMPLE

A (1,0,0) seed crystal of GaAs, approximately 400 grams of precompounded GaAs, 17 grams of dry boric oxide encapsulant, and sufficient arsenic to maintain a pressure of 1 atmosphere at the crystallization temperature of GaAs were successively introduced into a crystal growth container as illustrated in FIG. 2 comprising a 28 mm diameter pyrolytic boron nitride crucible in a silica outer vessel. The atmosphere of the vessel was then evacuated to approximately $10^{-7}$ torr and the vessel sealed with a quartz plug. The sealed container was introduced into a multi-zone furnace as illustrated in FIG. 1 with an approximately 100 mm long spike zone positioned between independently temperature controlled upper and lower zones of greater length.

The furnace utilized was a 44 inch long "spike" furnace manufactured by the Mellen Company, Inc. of Webster, N.H., comprising two 16 inch long furnace sections at each end of the assembly each comprising an 8 inch diameter steel outer shell and a 3 and ⅛ inch diameter bore with the intervening space filled with bulk fiber insulation. Each of the furnace sections was heated by four, individually controlled, 600 watt, flat ribbon type resistance heating elements, and water cooling coils were welded to the outer shells for cooling purposes. Thermocouples in wells extending to the furnace bore were provided for measuring furnace temperatures. The center "spike" furnace separating the end sections was a 4 inch long, quadrant tunable module section permitting three dimensional gradient tuning with four independently controlled quadrant, resistance heaters which could be configured to provide either a 1 inch long or a 2 inch long heated zone. Variable diameter adiabatic separators were provided on either side of the "spike" module to steepen the spike. Each end of the furnace was provided with a 3 inch ceramic vestibule and a 10 inch diameter steel mounting flange. The furnace was mounted in a frame suspended by two horizontal shafts journaled in pillow blocks supported in a standard "A" frame so that it could be tipped through a 180° angle about a horizontal axis.

All three furnace zones were initially maintained at 1200° C., and the boric oxide was permitted to melt and encapsulate the precompounded GaAs charge. The growth container was positioned with the seed crystal just below the molten subzone of the spike zone, and the temperature of the molten subzone was then raised to 1277° C. to melt the precompounded GaAs just above the seed crystal without melting the seed crystal until a molten region approximately 25 mm in length was established. The crystal growth container was then lowered at a rate of 5 mm/hr until all of the precompounded GaAs had passed through the molten subzone of the spike zone where it melted, and into the cooler lower zones where the GaAs resolidified in a shape conforming to the shape of the crucible.

The temperature of the spike zone was permitted to drop to 1200° C. and the growth container was raised again, this time to a slightly higher position with the seed crystal extending part way into the molten subzone. The temperature of the molten subzone was then raised again to 1277° C. to reestablish the melt zone, this time with the seed crystal being partially melted. The crystal growth container was thereafter lowered again at a rate of 5 mm/hr to remelt the GaAs in the molten subzone of the spike zone and then recrystallize the GaAs in the lower zones. The temperature of the molten subzone within the spike zone was again permitted to drop to a temperature in the range from 1100° to 1200° C., and the crystal growth container was raised all the way to the top of the furnace and the support rod was clamped in position. The furnace was then inverted by pivoting it about a horizontal axis, and the boric oxide encapsulant was permitted to run out through the opening in the top of the crucible into the inverted cup. After 24 hours in the inverted position, the furnace was gradually cooled at a rate of approximately 35° per hour to minimize stress in the crystal. The crystal was removed from the growth crucible by immersion in methanol and agitation in an ultrasonic cleaning unit.

Figure 7:
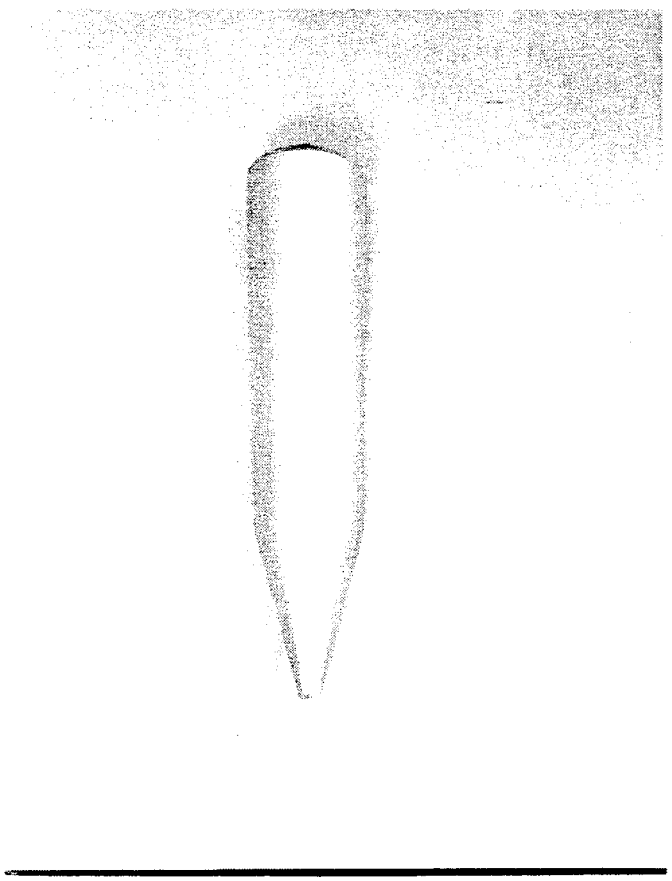
FIG. 7 is a photograph of an actual GaAs crystal grown using the method and apparatus of the invention.

The resulting crystal is shown in FIG. 7. It was found to be a semi-insulating single crystal with a resistivity of $5 \times 10^8$ ohm-cm; an EPD of $2-5 \times 10^{-3}$ cm$^{-2}$; a total EL2 of $1 \times 10^{16}$ cm$^{-3}$ and a neutral EL2 of $7 \times 10^{15}$ cm$^{-3}$.

Microscopic inspection revealed that the crystal produced as described above had a much lower dislocation density than conventional LEC produced GaAs crystals. FIG. 8 is a 50X photomicrograph of a portion of the crystal produced according to the preceding example, and FIG. 9 is a corresponding 50X photomicrograph of a commercially available GaAs crystal. Dislocations in the crystal structures are indicated by etch pits which show up as dark spots in the photographs. The lower dislocation density in the structure of the crystal produced according to the present invention is readily apparent from a comparison of the two photomicrographs.

The foregoing description and examples have been set forth merely to illustrate the invention and are not intended to be limiting. Since modifications of the described embodiments incorporating the spirit and substance of the invention may occur to persons skilled in the art, the scope of the invention should be limited solely with respect to the appended claims and equivalents.

What is claimed is:

1. A method of growing single crystals comprising the steps of:
    (a) introducing a seed crystal, an amount of crystal feed material, and an amount of boric oxide encapsulant material having a melting temperature lower than the melting temperature of said crystal feed material sufficient to encapsulate said crystal feed material when melted, into a non-reactive pyrolytic boron nitride vessel;
    (b) heating said vessel in a furnace to a temperature above the melting point of said boric oxide encapsulant and below the melting point of said crystal feed material and said seed crystal, and melting said encapsulant to coat said pyrolytic boron nitride vessel and encapsulate said crystal feed material, said crystal feed material corresponding substantially to the shape of said vessel;
    (c) passing said vessel along a substantially vertical path through a furnace zone having a length shorter than the length of said vessel and maintained at a temperature at least equal to the melting temperature of said crystal feed material to melt said crystal feed material to form a zone of molten crystal material conforming to the shape of said vessel and separated from said vessel only by a very thin layer of boric oxide encapsulant which preferentially wets the pyrolytic boron nitride vessel compared to said molten crystal material and prevents said molten crystal material from contacting said pyrolytic boron nitride vessel, said vessel being passed into an adjacent furnace zone maintained at a temperature above the melting temperature of said encapsulant and below the melting temperature of said crystal material to crystallize said crystal material in contact with said seed crystal so as to form a single crystal of said crystal material;

(d) tipping said vessel while maintaining said vessel at a temperature above the melting point of said boric oxide encapsulant and below the melting point of the crystallized material to decant encapsulant from said vessel; and (e) recovering said single crystal of said crystal material from said vessel.

2. A method of growing single crystals as recited in claim 1, wherein said seed crystal is positioned at the bottom of said vessel, and said vessel is passed along a vertical path.

3. A method of growing single crystals as recited in claim 1, wherein said furnace zone maintained at at least the melting temperature of said crystal material is arranged between two furnace zones maintained at a temperature above the melting point of the encapsulant but below the melting point of the crystal material, said two furnace zones each being at least equal in length to said vessel.

4. A method of growing single crystals as recited in claim 1, wherein said liquid encapsulant is decanted by said furnace with said vessel therein 180° about a horizontal axis so that said vessel is upside down.

5. A method of growing single crystals as recited in claim 1, further comprising the step of evacuating the atmosphere from said vessel and sealing said vessel with a plug prior to heating said vessel in said furnace to melt said encapsulant.

6. A method of growing single crystals as recited in claim 5, wherein an atmosphere material which is non-reactive toward said crystal material and is solid at room temperature and volatizes at the melting temperature of said crystal material is introduced into said vessel prior to evacuating the atmosphere from said vessel in order to provide a non-reactive atmosphere in said vessel in the furnace.

7. A method of growing single crystals as recited in claim 6, wherein said atmosphere material is a relatively more volatile component of the crystal material.

8. A method of growing single crystals as recited in claim 6, wherein the crystal material is GaAs and said atmosphere material is As.

9. A method of growing single crystals as recited in claim 1, further comprising the step of mounting said vessel on a support device reciprocably movable along a vertical path through said furnace zones.

10. A method of growing single crystals as recited in claim 1, wherein a portion of the seed crystal overlaps into said furnace zone which is above the melting point of the crystal material so as to melt said portion of said seed crystal along with said crystal material.

11. A method of growing single crystals as recited in claim 1, further comprising subjecting said crystal feed material to an initial pass through said furnace zone maintained at a temperature at least equal to the melting temperature of said crystal feed material to melt said crystal feed material and into said adjacent zone at a temperature above the melting temperature of said encapsulant and below the melting temperature of said crystal material to resolidify said crystal material in contact with said seed crystal and in a form corresponding to the shape of said vessel prior to passing said vessel through said furnace zone maintained at at least the melting temperature of said crystal material and into said adjacent zone to crystallize said crystal material with said seed crystal to form a single crystal of material.

12. A method of growing single crystals as recited in claim 1, wherein the heated length and temperature of said furnace zone maintained at at least the melting temperature of said crystal material are controlled with respect to the temperatures of said two furnace zones so as to cause a growth interface to form between the molten and crystalline phases of the crystal material which is convex in shape with respect to the crystalline phase of the material.

13. A method of growing single crystals as recited in claim 1, wherein said crystal material is GaAs.

14. A method of growing single crystals as recited in claim 1, wherein said crystal material is CdTe.

15. A method of growing single crystals as recited in claim 1, wherein said crystal material is InP.

16. A method as recited in claim 1, wherein said crystal feed material corresponding substantially to the shape of said vessel is formed by melting pieces of crystal feed material in said vessel and allowing molten crystal feed material to flow into conformance with said vessel.

17. A method of growing single crystals comprising the steps of:

(a) introducing a seed crystal, an amount of crystal feed material, and an amount of boric oxide encapsulant material having a melting temperature lower than the melting temperature of said crystal feed material sufficient to encapsulant said crystal feed material when melted, into a non-reactive pyrolytic boron nitride vessel, said crystal feed material being initially preformed in an unbroken mass according to the interior dimensions of said vessel;

(b) heating said vessel in a furnace to a temperature above the melting point of said boric oxide encapsulant and below the melting point of said crystal feed material and said seed crystal, and melting said encapsulant to coat said pyrolytic boron nitride vessel and encapsulate said crystal feed material, said crystal feed material corresponding substantially to the shape of said vessel;

(c) passing said vessel along a substantially vertical path through a furnace zone having length shorter than the length of said vessel and maintained at a temperature at least equal to the melting temperature of said crystal feed material to melt said crystal feed material to form a zone of molten crystal material conforming to the shape of said vessel and separated from said vessel only by a very thin layer of boric oxide encapsulant which preferentially wets the pyrolytic boron nitride vessel compared to said molten crystal material and prevents said molten crystal material from contacting said pyrolytic boron nitride vessel, said vessel being passed into an adjacent furnace zone maintained at a temperature above the melting temperature of said encapsulant and below the melting temperature of said crystal material to crystallize said crystal material in contact with said seed crystal so as to form a single crystal of said crystal material;

(d) tipping said vessel while maintaining said vessel at a temperature above the melting point of said boric oxide encapsulant and below the melting point of the crystallized material to decant encapsulant from said vessel; and (e) recovering said single crystal of said crystal material from said vessel.

18. A method of growing single crystals as recited in claim 17, wherein all of said crystal feed material is passed through said furnace zone maintained at at least the melting temperature of said crystal material so as to be melted therein.

19. A method of zone refining single crystals comprising the steps of:
(a) introducing a seed crystal, an amount of crystal feed material, and an amount of an encapsulant material having a melting temperature lower than the melting temperature of said crystal feed material sufficient to encapsulate said crystal feed material when melted, into a non-reactive pyrolytic vessel;
(b) heating said vessel in a furnace to a temperature above the melting point of said encapsulant and below the melting point of said crystal feed material and said seed crystal, and melting said encapsulant to encapsulate said crystal feed material, said crystal feed material corresponding substantially to the shape of said vessel;
(c) repeatedly passing said vessel in one direction along a substantially vertical path through a furnace zone having a length shorter than the length of said vessel and maintained at a temperature at least equal to the melting temperature of said crystal feed material to melt said crystal feed material to form a zone of molten material conforming to the shape of said vessel and separated from said vessel only by a very thin layer of encapsulant which preferentially wets the pyrolytic boron nitride vessel compared to said molten crystal material and prevents said molten crystal material from contacting said pyrolytic boron nitride vessel, said vessel being passed into an adjacent furnace zone maintained at a temperature above the melting temperature of said encapsulant and below the melting temperature of said crystal material to crystallize said crystal material in contact with said seed crystal so as to form a zone refined single crystal of said crystal material;
(d) tipping said vessel while maintaining said vessel at a temperature above the melting point of said boric oxide encapsulant and below the melting point of the crystallized material to decant encapsulant from said vessel; and
(e) recovering said zone refined single crystal of said crystal material from said vessel.

20. A method as recited in claim 19, wherein said vessel is passed at least ten times through said furnace zone maintained at at least the melting temperature of said crystal material to effect zone refining.

21. A method as recited in claim 19, wherein said crystal feed material corresponding substantially to the shape of said vessel is formed by melting pieces of crystal feed material in said vessel and allowing molten crystal feed material to flow into conformance with said vessel.

22. A method of zone leveling a dopant in a single crystal comprising the steps of:
(a) introducing a seed crystal, an amount of crystal feed material, a dopant material, and an amount of boric oxide encapsulant material having a melting temperature lower than the melting temperature of said crystal feed material sufficient to encapsulate said crystal feed material when melted, into a non-reactive pyrolytic boron nitride vessel;
(b) heating said vessel in a furnace to a temperature above the melting point of said boric oxide encapsulant and below the melting point of said crystal feed material and said seed crystal, and melting said encapsulant to coat said pyrolytic boron nitride vessel and encapsulate said crystal feed material, said crystal feed material corresponding substantially to the shape of said vessel;
(c) positioning said vessel in said furnace with said dopant material in a furnace zone having a length shorter than the length of said vessel and maintained at a temperature at least equal to the melting temperature of said crystal feed material to establish a molten zone, and passing said vessel along a substantially vertical path through said furnace zone to melt said crystal feed material to form a zone of molten material conforming to the shape of said vessel and separated from said vessel only by a very thin layer of encapsulant which preferentially wets the pyrolytic boron nitride vessel compared to said molten crystal material and prevents said molten crystal material from contacting said pyrolytic boron nitride vessel and to distribute the dopant; said vessel being passed into an adjacent furnace zone maintained at a temperature above the melting temperature of said encapsulant and below the melting temperature of said crystal material to crystallize said crystal material and dopant in contact with said seed crystal so as to form a doped single crystal of said crystal material;
(d) tipping said vessel while maintaining said vessel at a temperature above the melting point of said boric oxide encapsulant and below the melting point of the crystallized material to decant encapsulant from said vessel; and
(e) recovering said doped single crystal of said crystal material from said vessel.

23. A method as recited in claim 22, wherein said dopant is initially disposed adjacent said seed crystal.

24. A method as recited in claim 22, wherein said crystal feed material corresponding substantially to the shape of said vessel is formed by melting pieces of crystal feed material in said vessel and allowing molten crystal feed material to flow into conformance with said vessel.

* * * * *